United States Patent
Isakanian et al.

(10) Patent No.: US 12,334,725 B2
(45) Date of Patent: Jun. 17, 2025

(54) INTEGRATED CIRCUIT INTEGRATION OF T-COILS AT INTERFACES TO COMMUNICATION LINKS

(71) Applicant: QUALCOMM Incorporated, San Diego, CA (US)

(72) Inventors: Patrick Isakanian, El Dorado Hills, CA (US); Srivatsan Thiruvengadam, Carlsbad, CA (US); Darius Valaee, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 491 days.

(21) Appl. No.: 17/969,552

(22) Filed: Oct. 19, 2022

(65) Prior Publication Data

US 2024/0136812 A1    Apr. 25, 2024
US 2024/0235188 A9    Jul. 11, 2024

(51) Int. Cl.
*H02H 9/04* (2006.01)
*H01P 3/00* (2006.01)
*H03H 7/00* (2006.01)

(52) U.S. Cl.
CPC .............. *H02H 9/046* (2013.01); *H01P 3/00* (2013.01); *H03H 7/00* (2013.01)

(58) Field of Classification Search
CPC .. H02H 9/046; H01P 3/00; H03H 7/00; H01L 2223/6605; H01L 23/66; H01L 23/645; H04B 3/50; G11C 7/1069
See application file for complete search history.

(56) References Cited

U.S. PATENT DOCUMENTS

| | | | |
|---|---|---|---|
| 11,240,079 B1* | 2/2022 | Kushnir | H04L 5/0044 |
| 2006/0071714 A1 | 4/2006 | Ramaswamy et al. | |
| 2010/0225408 A1* | 9/2010 | Rofougaran | H03B 5/1268 331/181 |
| 2016/0211702 A1* | 7/2016 | Muratov | H01F 27/38 |
| 2019/0180931 A1 | 6/2019 | Yoo et al. | |
| 2020/0219828 A1* | 7/2020 | Liu | H01L 24/17 |
| 2020/0280295 A1* | 9/2020 | Fan | H10D 89/911 |
| 2022/0415788 A1* | 12/2022 | Wu | H01L 23/645 |
| 2024/0007058 A1* | 1/2024 | Ayranci | H03F 1/223 |

OTHER PUBLICATIONS

International Search Report and Written Opinion—PCT/US2023/073953—ISA/EPO—Mar. 13, 2024.

* cited by examiner

*Primary Examiner* — Fayyaz Alam
(74) *Attorney, Agent, or Firm* — Loza & Loza, LLP

(57) ABSTRACT

An integrated circuit (IC) including a first transceiver interface circuit extending longitudinally in a first direction substantially perpendicular to a second direction parallel to edge of the IC, wherein the first transceiver interface circuit comprises a first T-coil; and a second transceiver interface circuit extending longitudinally in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

21 Claims, 5 Drawing Sheets

IC EDGE

| | | | | | | | |
|---|---|---|---|---|---|---|---|
| T-COIL 464-1 | CLAMP 454-1 | ESD 456-1a | TX 458-1 | ESD 456-1b | DECAP 452-1 | RX 460-1 | CORE 462-1 |
| DECAP 452-2 | CLAMP 454-2 | ESD 456-2a | TX 458-2 | ESD 456-2b | T-COIL 464-2 | RX 460-2 | CORE 462-2 |
| T-COIL 464-3 | CLAMP 454-3 | ESD 456-3a | TX 458-3 | ESD 456-3b | DECAP 452-3 | RX 460-3 | CORE 462-3 |
| DECAP 452-4 | CLAMP 454-4 | ESD 456-4a | TX 458-4 | ESD 456-4b | T-COIL 464-4 | RX 460-4 | CORE 462-4 |
| T-COIL 464-5 | CLAMP 454-5 | ESD 456-5a | TX 458-5 | ESD 456-5b | DECAP 452-5 | RX 460-5 | CORE 462-5 |

IC EDGE

| | | | | | | |
|---|---|---|---|---|---|---|
| T-COIL 564-1 | DECAP 552-1 | CLAMP 554-1 | ESD 556-1 | TX 558-1 | RX 560-1 | CORE 562-1 |
| DECAP 552-2 | T-COIL 564-2 | CLAMP 554-2 | ESD 556-2 | TX 558-2 | RX 560-2 | CORE 562-2 |
| T-COIL 564-3 | DECAP 552-3 | CLAMP 554-3 | ESD 556-3 | TX 558-3 | RX 560-3 | CORE 562-3 |
| DECAP 552-4 | T-COIL 564-4 | CLAMP 554-4 | ESD 556-4 | TX 558-4 | RX 560-4 | CORE 562-4 |
| T-COIL 564-5 | DECAP 552-5 | CLAMP 554-5 | ESD 556-5 | TX 558-5 | RX 560-5 | CORE 562-5 |

000
INTEGRATED CIRCUIT INTEGRATION OF T-COILS AT INTERFACES TO COMMUNICATION LINKS

FIELD

Aspects of the present disclosure relate generally to communication links, such as double data rate (DDR) and serial-deserial (SERDES) links, and in particular, to integrated circuit (IC) integration of T-coils at the interfaces to communication links.

BACKGROUND

Communication links, such as double data rate (DDR) and serial-deserial (SERDES) links, are used to communicate data signals between integrated circuits (ICs) and other components. Often, the communication links include a set of parallel transmission lines, some of which may be differential transmission lines, pseudo-differential transmission lines, and single-ended transmission lines. Compensating the transmission lines of communication links for improved data rates and signal integrity is of interest.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC), including: a first transceiver interface circuit extending in a first direction substantially perpendicular to a second direction parallel to an edge of the IC, wherein the first transceiver interface circuit comprises a first T-coil; and a second transceiver interface circuit extending in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

Another aspect of the disclosure relates to a wireless communication device, including: at least one antenna; a transceiver coupled to the at least one antenna; a communication link including a set of transmission lines coupled to the transceiver; and an integrated circuit (IC) including a set of transceiver interface circuits coupled to the set of transmission lines, respectively, wherein: the first transceiver interface circuit of the set extends longitudinally in a first direction substantially perpendicular to a second direction parallel to an edge of the IC, wherein the first transceiver interface circuit comprises a first T-coil; and the second transceiver interface circuit of the set extends longitudinally in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 4 illustrates a layout or top view of another example integrated circuit (IC) in accordance with another aspect of the disclosure.

FIG. 5 illustrates a layout or top view of another example integrated circuit (IC) in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
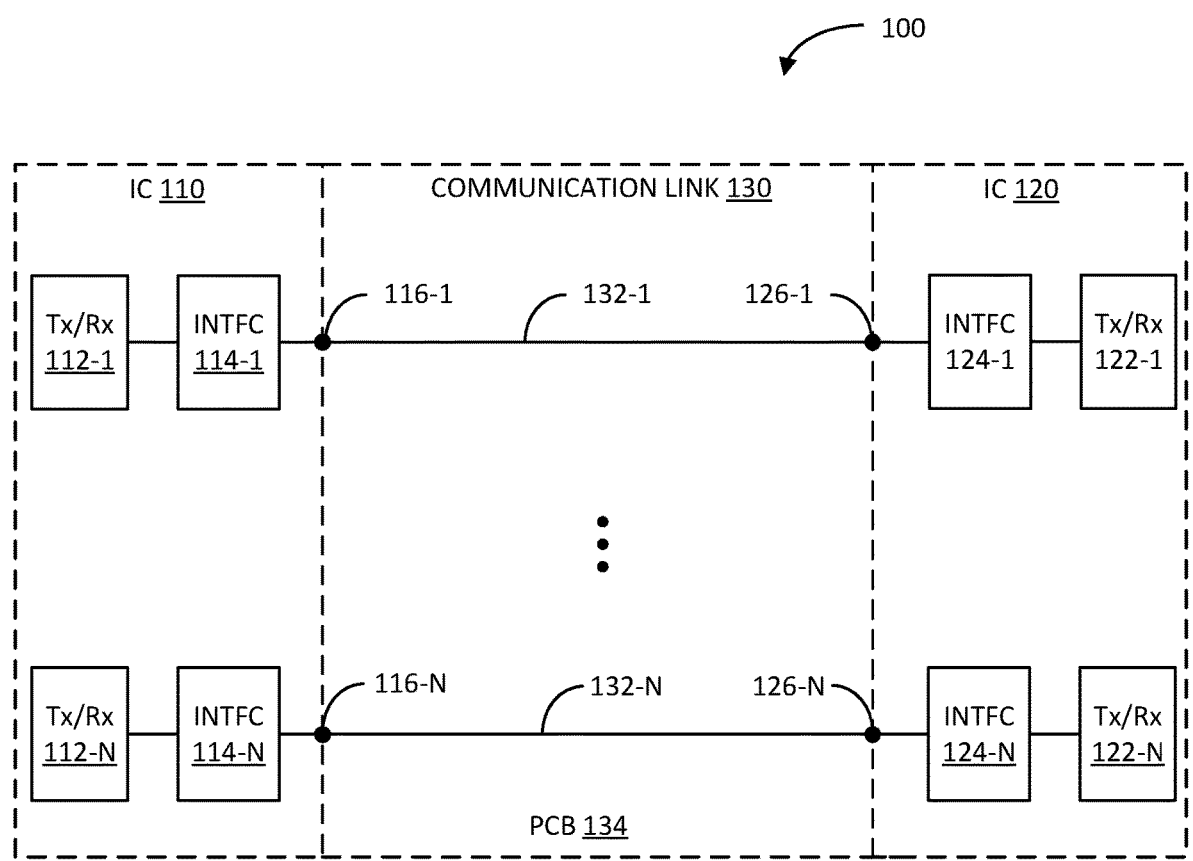
FIG. 1 illustrates a block diagram of an example communication system in accordance with an aspect of the disclosure.

FIG. 1 illustrates a block diagram of an example communication system 100 in accordance with an aspect of the disclosure. The communication system 100 includes a first integrated circuit (IC) 110, a second IC 120, and a communication link 130 signal coupling the first IC 110 to the second IC 120. In this example, the communication link 130 may be a double data rate (DDR) communication link with pseudo-differential transmission lines 132-1 to 132-N (where N may be a positive integer) formed on a printed circuit board (PCB) 134. It shall be understood that the communication link 130 may be implemented as other types of communication link, such as fully differential serial-deserial (SERDES) communication link.

The first IC 110, in turn, includes a set of N transceivers 112-1 to 112-N coupled to a set of N communication link interface circuits 114-1 to 114-N, respectively. The set of N interface circuits 114-1 to 114-N are coupled to the set of transmission lines 132-1 to 132-N of the communication link 130 via a set of IC pads 116-1 to 116-N, respectively. Similarly, the second IC 120, in turn, includes a set of N transceivers 122-1 to 122-N coupled to a set of N communication link interface circuits 124-1 to 124-N, respectively. The set of N interface circuits 124-1 to 124-N are coupled to the set of transmission lines 132-1 to 132-N of the communication link 130 via a set of IC pads 126-1 to 126-N, respectively. Each transceiver and corresponding interface circuit may be collectively referred to herein as a transceiver interface circuit.

Figure 2A:
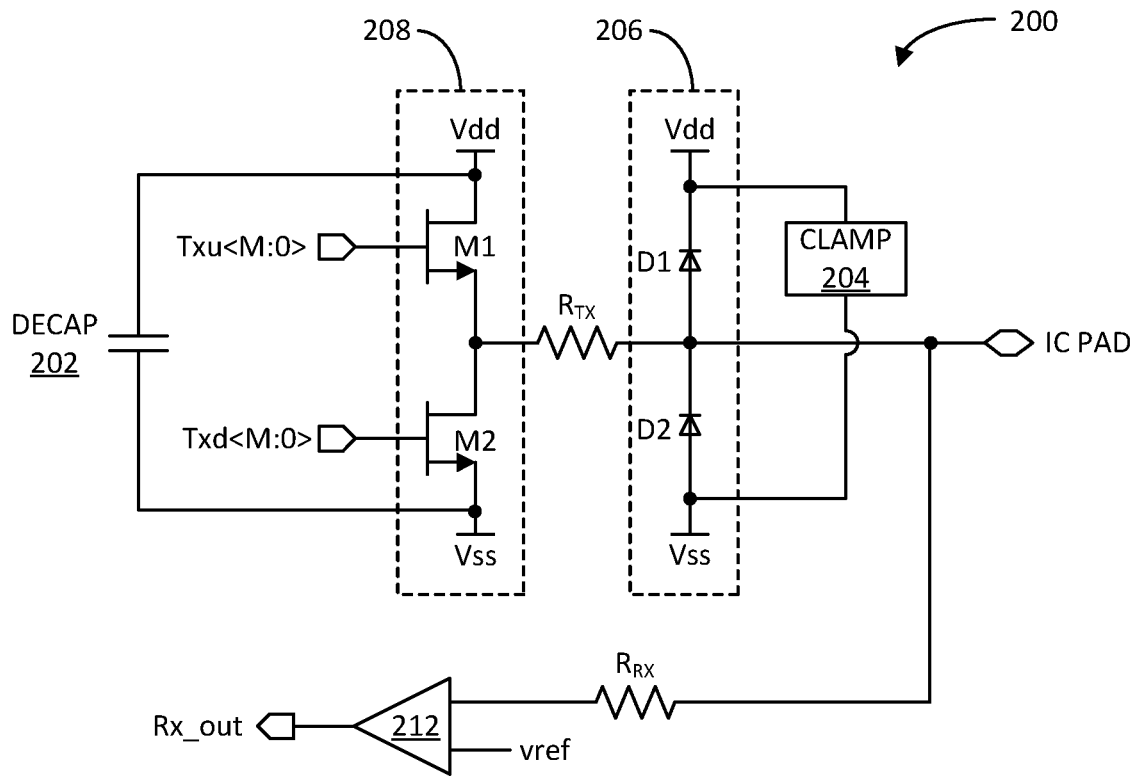
FIG. 2A illustrates a schematic diagram of an example transceiver interface circuit in accordance with another aspect of the disclosure.

FIG. 2A illustrates a schematic diagram of an example transceiver interface circuit 200 in accordance with another aspect of the disclosure. The transceiver interface circuit 200 may be an example implementation of one of transceiver interface circuit 112-1/114-1 to 112-N/114-N or 122-1/124-1 to 122-N/124-N. In particular, the transceiver interface circuit 200 includes a decoupling capacitor 202, a transmitter 208, an electrostatic discharge (ESD) circuit 206, a clamp 204, and a receiver 212.

The transmitter 208, in turn, includes a first transistor M1 (e.g., a field effect transistor (FET), or more specifically, an n-channel metal oxide semiconductor (NMOS) FET), a second transistor M2 (e.g., a FET or NMOS FET) coupled in series between an upper voltage rail Vdd and a lower voltage rail Vss (e.g., ground). That is, the first FET M1 includes a drain coupled to the upper voltage rail Vdd, a gate configured to receive a transmit pull-up signal Txu<M:0>, and a source coupled to the drain of the second FET M2. The second FET M2, in turn, includes a gate configured to receive a transmit pull-down signal Txd<M:0>, and a source coupled to the lower voltage rail Vss. The node between the transistors M1 and M2 may be the output of the transmitter 208. Although a single slice of the transmitter 208 is shown, it shall be understood that the transmitter 208 may be $2^M$ parallel slices of the M1/M2 transistor configuration. The transmitter 208 may also be referred to as a digital-to-analog converter (DAC).

The transceiver interface circuit 200 may further include a transmitter-side resistor Rix coupled between the output of the transmitter 208 and an IC pad, which, in turn, is coupled to a transmission line (e.g., one of transmission lines 132-1 to 132-N of communication link 130). The resistor Rix may protect the transmitter 208 from electrostatic charge coming from the IC pad. The decoupling capacitor 202 is coupled between the upper voltage rail Vdd and the lower voltage rail Vss.

The ESD circuit 206, in turn, includes a first reverse-bias diode D1 coupled in series with a second reverse-bias diode D2 between the upper voltage rail Vdd and the lower voltage rail Vss. That is, the cathode of diode D1 is coupled to the upper voltage rail Vdd; the anode of diode D1 and the cathode of diode D2 are coupled together at the IC pad; and the anode of diode D1 is coupled to the lower voltage rail Vss. The diodes D1 and D2 are sometimes referred to as human body model (HBM) diodes. The clamp 204 is coupled between the upper voltage rail Vdd and the lower voltage rail Vss.

The receiver 212 includes a first input coupled to the IC pad via a receiver-side resistor $R_{RX}$. The resistor $R_{RX}$ may protect the receiver 208 from electrostatic charge coming from the IC pad. For pseudo-differential signal detection, the receiver 212 includes a second input configured to receive a reference voltage vref. The receiver 212 includes an output Rx_out configured to generate the detected receive signal; the output Rx_out may be coupled to a core of the IC. Similarly, the core of the IC may also be coupled to the gates of transistors M1 and M2 of the transmitter 208 to provide the latter of transmit pull-up and pull-down signals Txu<M:0> and Txd<M:0>, respectively.

Figure 2B:
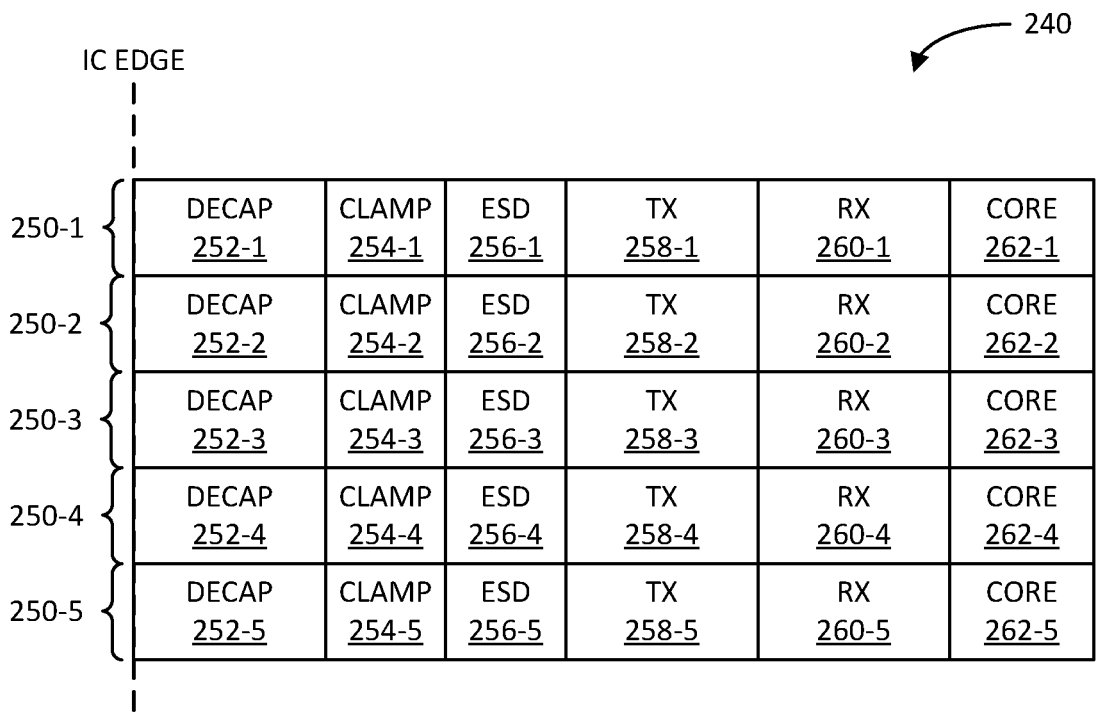
FIG. 2B illustrates a layout or top view of an example integrated circuit (IC) in accordance with another aspect of the disclosure.

FIG. 2B illustrates a layout or top view of an example integrated circuit (IC) 240 in accordance with another aspect of the disclosure. In this example, the IC 240 includes five (5) transceiver interface circuits 250-1 to 250-5, which may be coupled to five (5) transmission lines (e.g., 132-1 to 132-5) of a communication link (e.g., 130). Although five (5) transceiver interface circuits 250-1 to 250-5 are shown for descriptive purposes, it shall be understood that the IC 240 may include a different number of transceiver interface circuits.

From a layout perspective, the transceiver interface circuits 250-1 to 250-5 are staggered (e.g., substantially abutted or adjacent to each other) along an IC edge (or boundary) direction (e.g., bit-to-bit direction, or data lane direction). The various components of each of the transceiver interface circuits 250-1 to 250-5 extend longitudinally from the IC edge in a direction perpendicular (orthogonal) to the IC edge direction. For example, the transceiver interface circuit 250-1 includes a decoupling capacitor 252-1, a clamp 254-1, an ESD circuit 256-1, a transmitter 258-1, a receiver 260-1, and a core input 262-1, all of which collectively extend from the IC edge in the direction perpendicular to the IC edge direction. Similarly, the transceiver interface circuit 250-2 includes a decoupling capacitor 252-2, a clamp 254-2, an ESD circuit 256-2, a transmitter 258-2, a receiver 260-2, and a core input 262-2, all of which collectively extend longitudinally from the IC edge in the direction perpendicular to the IC edge direction.

The above arrangement continues along the IC edge direction. The transceiver interface circuit 250-3 is staggered (e.g., substantially abutted or adjacent to each other) from the transceiver interface circuit 250-2 along the IC edge direction, and includes a decoupling capacitor 252-3, a clamp 254-3, an ESD circuit 256-3, a transmitter 258-3, a receiver 260-3 and a core input 262-3, all of which collectively extend longitudinally from the IC edge in the direction perpendicular to the IC edge direction. The transceiver interface circuit 250-4 is staggered (e.g., substantially abutted or adjacent to each other) from the transceiver interface circuit 250-3 along the IC edge direction, and includes a decoupling capacitor 252-4, a clamp 254-4, an ESD circuit 256-4, a transmitter 258-4, a receiver 260-4, and a core input 262-4, all of which collectively extend longitudinally from the IC edge in the direction perpendicular to the IC edge direction. The transceiver interface circuit 250-5 is staggered (e.g., substantially abutted or adjacent to each other) from the transceiver interface circuit 250-4 along the IC edge direction, and includes a decoupling capacitor 252-5, a clamp 254-5, an ESD circuit 256-5, a transmitter 258-5, a receiver 260-5, and a core input 262-5, all of which collectively extend longitudinally from the IC edge in the direction perpendicular to the IC edge direction.

In this layout arrangement, the decoupling capacitors 252-1 to 252-5 substantially align along the IC edge direction; the clamps 254-1 to 252-5 substantially align along the IC edge direction; the ESD circuits 256-1 to 256-5 substantially align along the IC edge direction; the transmitters 258-1 to 258-5 substantially align along the IC edge direction; and the receivers 260-1 to 260-4 substantially align along the IC edge direction.

A drawback of the IC 240 including the transceiver interface circuit 200 is that the ESD circuits 256-1 to 256-5 and 206 may each introduce significant parasitic capacitance to the IC pad. For example, the reverse-bias diodes D1 and D2 of ESD circuit 206 may be modeled from a capacitance perspective as two shunt capacitors. Additionally, other components such as the output of the transceiver 208 and the input of the receiver 212 contribute further parasitic capacitance to the IC pad. Thus, the transmit signal being transmitted via the IC pad and/or the receive signal being received via the IC pad may lose significant signal integrity at the IC pad due to the parasitic capacitance. This is especially true if the transmit and receive signals have relatively high data rates.

Figure 3A:
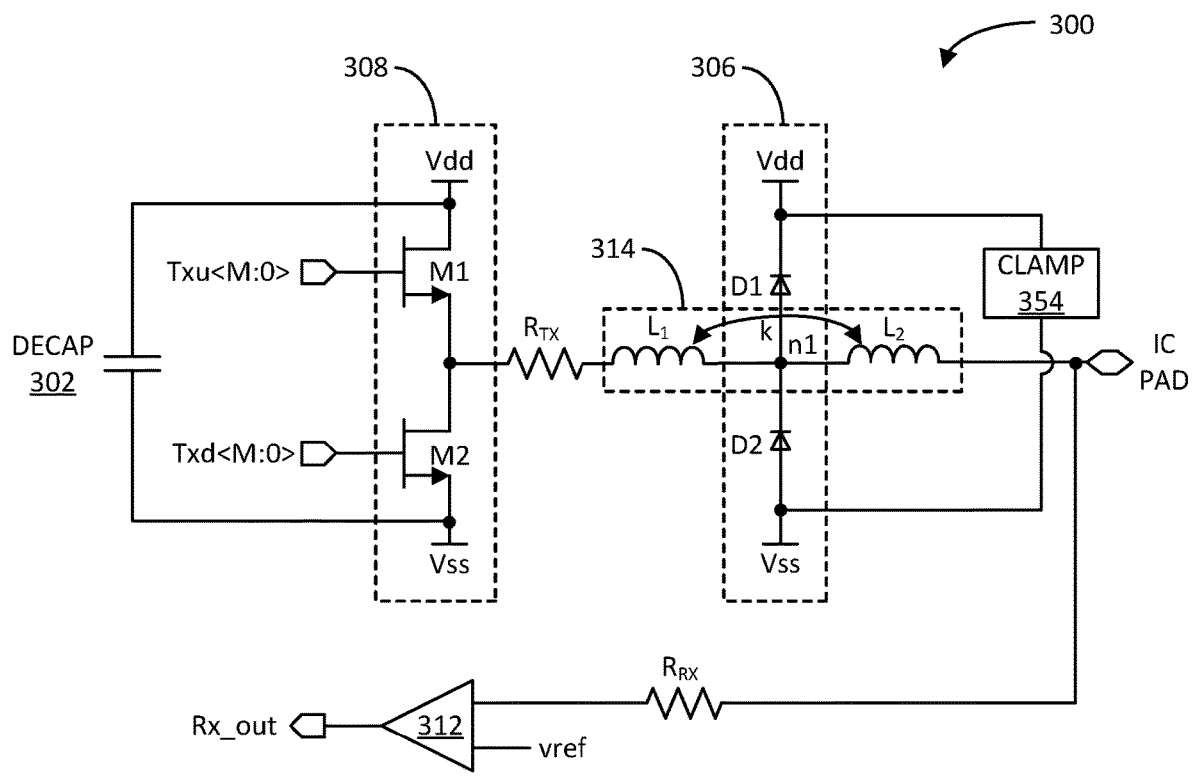
FIG. 3A illustrates a schematic diagram of another example transceiver interface circuit in accordance with another aspect of the disclosure.

FIG. 3A illustrates a schematic diagram of another example transceiver interface circuit 300 in accordance with another aspect of the disclosure. One solution to improve the signal integrity at the IC pad (as well as improve/increase the data rates of the transmit and receive signals) is to add a T-coil to compensate for the parasitic capacitance. The T-coil effectively cancels or reduce the parasitic capacitance at the IC pad; thereby, improving signal integrity and data rates for the signals. The transceiver interface circuit 300 is similar to transceiver interface circuit 200 previously discussed in detail including many similar elements identified by the same reference numbers with the most significant digit being a "3" in transceiver interface circuit 300 compared to a "2" in transceiver interface circuit 200.

As mentioned, the transceiver interface circuit 300 further includes a T-coil 314 including a first inductor $L_1$ and a second inductor $L_2$, which are mutually coupled by a coupling factor k. The first and second inductors $L_1$ and $L_2$ are coupled in series from the transmitter-side resistor $R_{TX}$ to the IC pad, where the node n1 between the inductors $L_1$ and $L_2$ coincides with the node n1 between the ESD diodes D1 and D2. As discussed, the T-coil 314 compensates for the parasitic capacitance of the ESD diodes D1 and D2 and other parasitic capacitance to reduce the parasitic capacitance at the IC pad. This improves the signal integrity and allows for higher data rate signals.

Figure 3B:
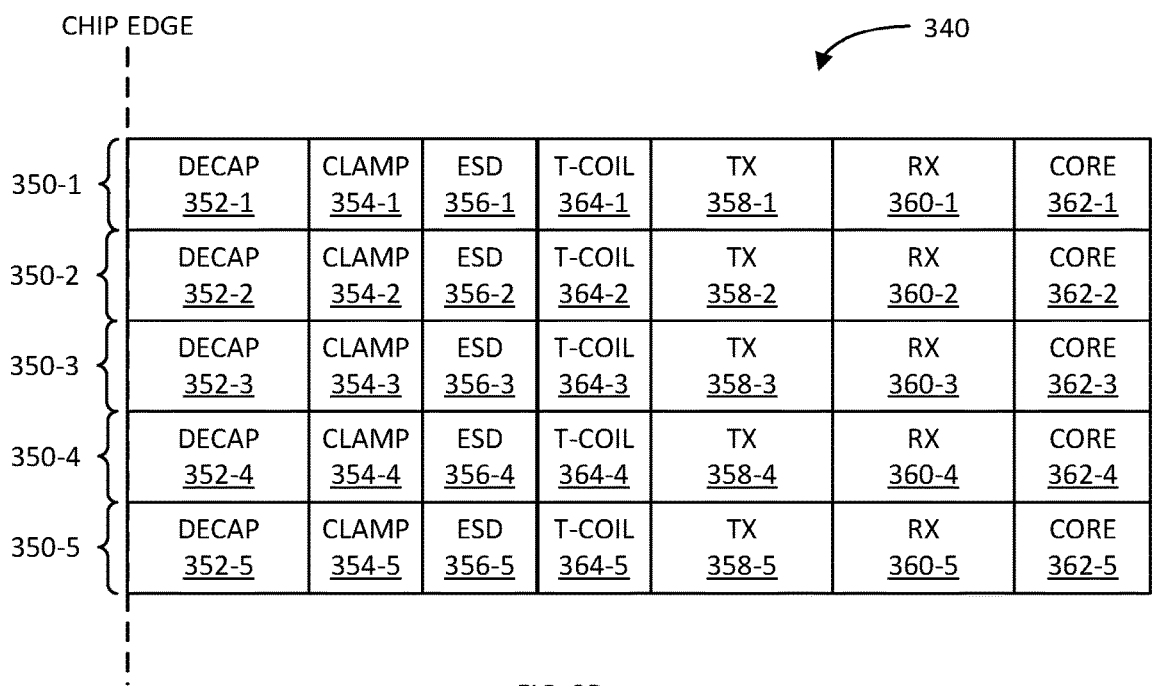
FIG. 3B illustrates a layout or top view of another example integrated circuit (IC) in accordance with another aspect of the disclosure.

FIG. 3B illustrates a layout or top view of an integrated circuit (IC) 340 in accordance with another aspect of the disclosure. In this example, the IC 340 includes five (5) transceiver interface circuits 350-1 to 350-5, which may be coupled to five (5) transmission lines (e.g., 132-1 to 132-5) of a communication link (e.g., 130). Although five (5) transceiver interface circuits 350-1 to 350-5 are shown for descriptive purposes, it shall be understood that the IC 340 may include a different number of transceiver interface circuits.

From a layout perspective, the transceiver interface circuits 350-1 to 350-5 are staggered (e.g., substantially abutted or adjacent to each other) along an IC edge (or boundary) direction (e.g., bit-to-bit direction, or data lane direction). The various components of each of the transceiver interface circuits 350-1 to 350-5 extend longitudinally from the IC edge in a direction perpendicular (orthogonal) to the IC edge direction. For example, the transceiver interface circuit 350-1 includes a decoupling capacitor 352-1, a clamp 354-1, an ESD circuit 356-1, a T-coil 364-1, a transmitter 358-1, a receiver 360-1, and a core input 362-1, all of which collectively extend longitudinally from the IC edge in the direction perpendicular to the IC edge direction. Similarly, the transceiver interface circuit 350-2 includes a decoupling capacitor 352-2, a clamp 354-2, an ESD circuit 356-2, a T-coil 364-2, a transmitter 358-2, a receiver 360-2, and a core input 362-2, all of which collectively extend longitudinally from the IC edge in the direction perpendicular to the IC edge direction.

The above arrangement continues along the IC edge direction. The transceiver interface circuit 350-3, which is staggered (e.g., substantially abutted or adjacent to each other) from the transceiver interface circuit 350-2 along the IC edge direction, includes a decoupling capacitor 352-3, a clamp 354-3, an ESD circuit 356-3, a T-coil 364-3, a transmitter 358-3, a receiver 360-3 and a core input 362-3, all of which collectively extend longitudinally from the IC edge in the direction perpendicular to the IC edge direction. The transceiver interface circuit 350-4, which is staggered (e.g., substantially abutted or adjacent to each other) from the transceiver interface circuit 350-3 along the IC edge direction, includes a decoupling capacitor 352-4, a clamp 354-4, an ESD circuit 356-4, a T-coil 364-4, a transmitter 358-4, a receiver 360-4, and a core input 362-4, all of which collectively extend longitudinally from the IC edge in the direction perpendicular to the IC edge direction. The transceiver interface circuit 350-5, which is staggered (e.g., substantially abutted or adjacent to each other) from the transceiver interface circuit 350-2 along the IC edge direction, includes a decoupling capacitor 352-5, a clamp 354-5, an ESD circuit 356-4, a T-coil 364-5, a transmitter 358-5, a receiver 360-5, and a core input 362-5, all of which collectively extend longitudinally from the IC edge in the direction perpendicular to the IC edge direction.

In this layout arrangement, the decoupling capacitors 352-1 to 352-5 substantially align along the IC edge direction; the clamps 354-1 to 352-5 substantially align along the IC edge direction; the ESD circuits 356-1 to 356-5 substantially align along the IC edge direction; the T-coils 364-1 to 364-5 substantially align along the IC edge direction; the transmitters 358-1 to 358-5 substantially align along the IC edge direction; and the receivers 360-1 to 360-4 substantially align along the IC edge direction.

A drawback of the IC 340 stems from the fact that the T-coils 364-1 to 364-5 lie are staggered (e.g., substantially abutted or adjacent to each other) along the IC edge direction. In such arrangement, the close proximity of adjacent T-coils in the IC edge direction (e.g., 364-1 and 364-2, 364-2 and 364-3, 364-3 and 364-4, and 364-4 and 364-5) causes their mutual inductance to interfere with each other. As a result, the transmit and/or receive signals of the transceiver interface circuits 350-1 to 350-5 cross-couple and interfere with each other; thereby, deteriorating signal integrity across the data lanes.

FIG. 4 illustrates a layout or top view of another integrated circuit (IC) 400 in accordance with another aspect of the disclosure. A layout approach to reduce or eliminate mutual coupling between T-coils associated with different transceiver interface circuits is to arrange the T-coils such that T-coils of adjacent transceiver interface circuits do not align along the IC edge direction. Stated differently, each T-coil is offset from the T-coil in the adjacent transceiver interface circuit along the direction orthogonal to the IC edge direction. Or, in other words, their respective distances from the IC edge are different. The particular T-coil arrangement in IC 400 may be referred to as a cell rotation arrangement because the T-coils alternates between a first position (e.g., closest to the IC edge) and a second position (e.g., sixth position from the IC edge) from transceiver interface circuit to adjacent transceiver interface circuit.

Again, in this example, the IC 400 includes five (5) transceiver interface circuits 450-1 to 450-5, which may be coupled to five (5) transmission lines (e.g., 132-1 to 132-5) of a communication link (e.g., 130); but may include more or less than five (5). From a layout perspective, the transceiver interface circuits 450-1 to 450-5 are staggered (e.g., and substantially abutted or adjacent to each other) along an IC edge (or boundary) direction (e.g., bit-to-bit direction, or data lane direction). The various components of each of the transceiver interface circuits 450-1 to 450-5 collectively extend longitudinally from the IC edge in a direction perpendicular (orthogonal) to the IC edge direction.

For example, the transceiver interface circuit 450-1 includes a T-coil 464-1, a clamp 454-1, a first ESD circuit 456-1a, a transmitter 458-1, an optional second ESD circuit 456-1b, a decoupling capacitor 452-1, a receiver 460-1, and a core input 462-1, all of which collectively extend longitudinally from the IC edge in the direction perpendicular to the IC edge direction. The transceiver interface circuit 450-2 includes a decoupling capacitor 452-2, a clamp 454-2, a first ESD circuit 456-2a, a transmitter 458-2, an optional second ESD circuit 456-2b, a T-coil 464-2, a receiver 460-2, and a core input 462-2, all of which collectively extend longitudinally from the IC edge in the direction perpendicular to the IC edge direction.

Similarly, the transceiver interface circuit 450-3 includes a T-coil 464-3, a clamp 454-3, a first ESD circuit 456-3a, a transmitter 458-3, an optional second ESD circuit 456-3b, a decoupling capacitor 452-3, a receiver 460-3, and a core input 462-3, all of which collectively extend longitudinally from the IC edge in the direction perpendicular to the IC edge direction. The transceiver interface circuit 450-4 includes a decoupling capacitor 452-4, a clamp 454-4, a first ESD circuit 456-4a, a transmitter 458-4, an optional second ESD circuit 456-4b, a T-coil 464-4, a receiver 460-4, and a core input 462-4, all of which collectively extend longitudinally from the IC edge in the direction perpendicular to the IC edge direction. Finally, the transceiver interface circuit 450-5 includes a T-coil 464-5, a clamp 454-5, a first ESD circuit 456-5a, a transmitter 458-5, an optional second ESD circuit 456-5b, a decoupling capacitor 452-5 a receiver 460-5, and a core input 462-5, all of which collectively extend longitudinally from the IC edge in the direction perpendicular to the IC edge direction.

As previously mentioned, the T-coils exhibit cell rotation in accordance with the layout of IC 400 (rotating between the first and sixth positions along the IC edge (bit or data lane direction). For example, the T-Coil 464-1 of transceiver interface circuit 450-1 is in the first position (closest to the IC edge); the T-Coil 464-2 of the next adjacent transceiver interface circuit 450-2 is in the sixth position (from the IC edge); the T-Coil 464-3 of the next adjacent transceiver interface circuit 450-3 is in the first position (closest to the IC edge); the T-Coil 464-4 of the next adjacent transceiver interface circuit 450-4 is in the sixth position (from the IC edge); and the T-Coil 464-5 of the next adjacent transceiver interface circuit 450-5 is in the sixth position (from the IC edge).

Similarly, the decoupling capacitors exhibit a complementary cell rotation in accordance with the layout of IC 400 (rotating between the sixth and first positions along the IC edge (bit or data lane direction). For example, the decoupling capacitor 452-1 of transceiver interface circuit 450-1 is in the sixth position (from the IC edge); the decoupling capacitor 452-2 of the next adjacent transceiver interface circuit 450-2 is in the first position (closest to the IC edge); the decoupling capacitor 452-3 of the next adjacent transceiver interface circuit 450-3 is in the sixth position (from the IC edge); the decoupling capacitor 452-4 of the next adjacent transceiver interface circuit 450-4 is in the first position (from the IC edge); and the decoupling capacitor 452-5 of the next adjacent transceiver interface circuit 450-5 is in the sixth position (from the IC edge).

FIG. 5 illustrates a layout or top view of another integrated circuit (IC) 500 in accordance with another aspect of the disclosure. Similarly, the layout approach to reduce or eliminate mutual coupling between T-coils associated with different transceiver interface circuits is to arrange the T-coils such that T-coils of adjacent transceiver interface circuits do not align along the IC edge direction. Stated differently, each T-coil is offset from the T-coil in the adjacent transceiver interface circuit along the direction orthogonal to the IC edge direction. Or, in other words, their respective distances from the IC edge are different. The particular T-coil arrangement in IC 500 may be referred to as a checkerboard arrangement because the T-coils alternates between a first position (e.g., closest to the IC edge) and a second position (e.g., second position from the IC edge) from transceiver interface circuit to adjacent transceiver interface circuit.

Again, in this example, the IC 500 includes five (5) transceiver interface circuits 550-1 to 550-5, which may be coupled to five (5) transmission lines (e.g., 132-1 to 132-5) of a communication link (e.g., 130); but may include more or less than five (5). From a layout perspective, the transceiver interface circuits 550-1 to 550-5 are staggered (e.g., substantially abutted or adjacent to each other) along an IC edge (or boundary) direction (e.g., bit-to-bit direction, or data lane direction). The various components of each of the transceiver interface circuits 550-1 to 550-5 collectively extend longitudinally from the IC edge in a direction perpendicular (orthogonal) to the IC edge direction.

For example, the transceiver interface circuit 550-1 includes a T-coil 564-1, a decoupling capacitor 552-1, a clamp 554-1, an ESD circuit 556-1, a transmitter 558-1, a receiver 560-1, and a core input 562-1, all of which collectively extend longitudinally from the IC edge in the direction perpendicular to the IC edge direction. The transceiver interface circuit 550-2 includes a decoupling capacitor 552-2, T-coil 564-2, a clamp 554-2, an ESD circuit 556-2, a transmitter 558-2, a receiver 560-2, and a core input 562-2, all of which collectively extend longitudinally from the IC edge in the direction perpendicular to the IC edge direction.

Similarly, the transceiver interface circuit 550-3 includes a T-coil 564-3, a decoupling capacitor 552-3, a clamp 554-3, an ESD circuit 556-3, a transmitter 558-3, a receiver 560-3, and a core input 562-3, all of which collectively extend longitudinally from the IC edge in the direction perpendicular to the IC edge direction. The transceiver interface circuit 550-4 includes a decoupling capacitor 552-4, T-coil 564-4, a clamp 554-4, an ESD circuit 556-4, a transmitter 558-4, a receiver 560-4, and a core input 562-4, all of which collectively extend longitudinally from the IC edge in the direction perpendicular to the IC edge direction. The transceiver interface circuit 550-5 includes a T-coil 564-5, a decoupling capacitor 552-5, a clamp 554-5, an ESD circuit 556-5, a transmitter 558-5, a receiver 560-5, and a core input 562-5, all of which collectively extend longitudinally from the IC edge in the direction perpendicular to the IC edge direction.

As previously mentioned, the T-coils exhibit checkerboard placement in accordance with the layout of IC 500 (checkerboard arrangement between the first and second positions along the IC edge (bit or data lane direction)). For example, the T-Coil 564-1 of transceiver interface circuit 550-1 is in the first position (closest to the IC edge); the T-Coil 564-2 of the next adjacent transceiver interface circuit 550-2 is in the second position (from the IC edge); the T-Coil 564-3 of the next adjacent transceiver interface circuit 550-3 is in the first position (closest to the IC edge); the T-Coil 564-4 of the next adjacent transceiver interface circuit 550-4 is in the second position (from the IC edge); and the T-Coil 564-5 of the next adjacent transceiver interface circuit 550-5 is in the sixth position (from the IC edge).

Similarly, the decoupling capacitors exhibit a complementary checkerboard arrangement in accordance with the layout of IC 500 (checkerboard arrangement between the second and first positions along the IC edge (bit or data lane direction)). For example, the decoupling capacitor 552-1 of transceiver interface circuit 550-1 is in the second position (from the IC edge); the decoupling capacitor 552-2 of the next adjacent transceiver interface circuit 550-2 is in the first position (closest to the IC edge); the decoupling capacitor 552-3 of the next adjacent transceiver interface circuit 550-3 is in the second position (from the IC edge); the decoupling capacitor 552-4 of the next adjacent transceiver interface circuit 550-4 is in the first position (from the IC edge); and the decoupling capacitor 552-5 of the next adjacent transceiver interface circuit 550-5 is in the second position (from the IC edge).

Figure 6:
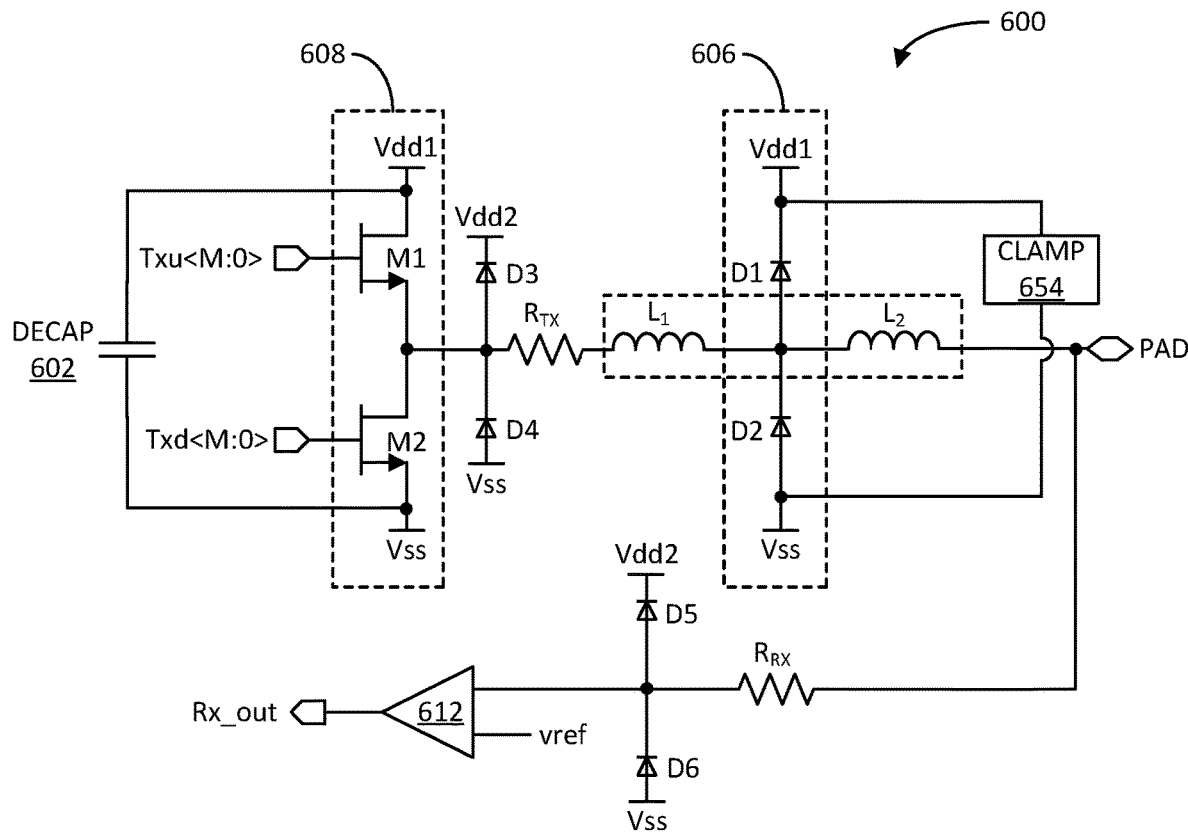
FIG. 6 illustrates a schematic diagram of another example transceiver interface circuit in accordance with another aspect of the disclosure.

FIG. 6 illustrates a schematic diagram of another example transceiver interface circuit 600 in accordance with another aspect of the disclosure. The transceiver interface circuit 600 is similar to transceiver interface circuit 300 previously discussed in detail including many similar elements identified by the same reference numbers with the most significant digit being a "6" in transceiver interface circuit 600 compared to a "3" in transceiver interface circuit 300.

The transceiver interface circuit 600 differs from transceiver interface circuit 300 in that the transceiver interface circuit 600 includes additional protection diodes for the transmitter 608 and the receiver 612. For example, the transceiver interface circuit 600 includes transmitter protection reverse-bias diodes D3 and D4 coupled in series between a second upper voltage rail Vdd2 and a lower voltage rail Vss (e.g., ground). That is, the diode D3 includes a cathode coupled to the second upper voltage rail Vdd2, and an anode coupled to the cathode of diode D4 at the output of the transmitter 608; and the diode D4 includes an anode coupled to the lower voltage rail Vss. Note, in transceiver interface circuit 600, the transmitter and ESD circuit 606 are coupled between a first upper voltage rail Vdd1 and the lower voltage rail Vss.

Similarly, the transceiver interface circuit 600 further includes receiver protection reverse-bias diodes D5 and D6 coupled in series between the second upper voltage rail Vdd2 and the lower voltage rail Vss. That is, the diode D5 includes a cathode coupled to the second upper voltage rail Vdd2, and an anode coupled to the cathode of diode D6 at the first input of the receiver 612; and the diode D6 includes an anode coupled to the lower voltage rail Vss.

Figure 7:
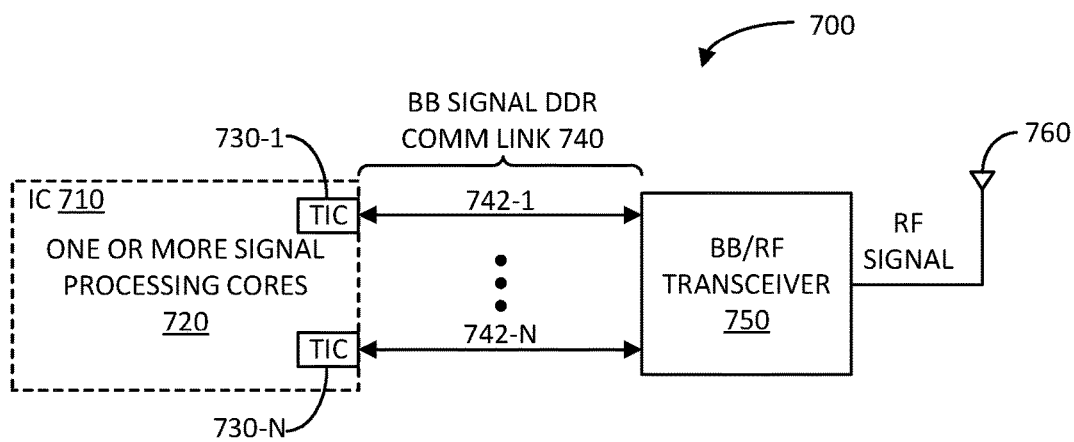
FIG. 7 illustrates a block diagram of an example wireless communication device in accordance with another aspect of the disclosure.

FIG. 7 illustrates a block diagram of an example wireless communication device 700 in accordance with another aspect of the disclosure. The wireless communication device 700 may be a smart phone, a desktop computer, laptop computer, tablet device, Internet of Things (IoT), wearable wireless device (e.g., wireless watch), and other types of wireless device.

In particular, the wireless communication device 700 includes an integrated circuit (IC) 710, which may be implemented as a system on chip (SOC). The IC 710 includes one or more signal processing cores 720 configured to generate a transmit baseband (BB) signal and process a received baseband (BB) signal. The IC 710 additionally includes a set of transceiver interface circuits (TIC) 730-1 to 730-N coupled to a set of transmission lines 742-1 to 740-N of a baseband signal double data rate (DDR) communication link 740 coupling the IC 710 to a baseband/radio frequency (BB/RF) transceiver 750. The set of transceiver interface circuits (TIC) 730-1 to 730-N may be implemented per ICs 400 and 500 previously discussed.

The transceiver 750 is coupled to the one or more signal processing cores 720 to receive therefrom the transmit BB signal and provide thereto the received BB signal via the BB signal DDR communication interface 740. The transceiver 750 is configured to convert the transmit BB signal into a transmit radio frequency (RF) signal, and convert a received RF signal into the received BB signal. The transceiver 750 is coupled to the at least one antenna 760 to provide thereto the transmit RF signal for electromagnetic radiation into a wireless medium for wireless transmission, and receive the received RF signal electromagnetically picked up from the wireless medium by the at least one antenna 760.

The following provides an overview of aspects of the present disclosure:

Aspect 1: An integrated circuit (IC), comprising: a first transceiver interface circuit extending longitudinally in a first direction substantially perpendicular to a second direction parallel to an edge of the IC, wherein the first transceiver interface circuit comprises a first T-coil; and a second transceiver interface circuit extending longitudinally in the second direction, wherein the second transceiver interface circuit is staggered from the first transceiver interface circuit along the second direction, wherein the second transceiver interface circuit includes a second T-coil, and wherein the second T-coil is offset from the first T-coil along the first direction.

Aspect 2: The IC of aspect 1, wherein: the first transceiver interface circuit further includes a first decoupling capacitor, wherein the first T-coil is situated between the edge of the IC and the first decoupling capacitor; and the second transceiver interface circuit further includes a second decoupling capacitor, wherein the second decoupling capacitor is situated between the edge of the IC and the second T-coil.

Aspect 3: The IC of aspect 2, wherein the first T-coil and the second decoupling capacitor substantially align along the second direction.

Aspect 4: The IC of aspect 2 or 3, wherein the first decoupling capacitors and the second T-coil substantially align along the second direction.

Aspect 5: The IC of any one of aspects 2-4, wherein: the first transceiver interface circuit further includes a first clamp, wherein the first clamp is situated between the first T-coil and the first decoupling capacitor; and the second transceiver interface circuit further includes a second clamp, wherein the second clamp is situated between the second T-coil and the second clamp.

Aspect 6: The IC of aspect 5, wherein the first and second clamps substantially align along the second direction.

Aspect 7: The IC of any one of aspects 2-6, wherein: the first transceiver interface circuit further includes a first electrostatic discharge (ESD) circuit, wherein the first ESD circuit is situated between the first T-coil and the first decoupling capacitor; and the second transceiver interface circuit further includes a second ESD circuit, wherein the second ESD circuit is situated between the second T-coil and the second decoupling capacitor.

Aspect 8: The IC of aspect 7, wherein the first and second ESD circuits substantially align along the second direction.

Aspect 9: The IC of aspect 7 or 8, wherein: the first transceiver interface circuit further includes a third ESD circuit, wherein the first and third ESD circuits are situated between the first T-coil and the first decoupling capacitor; and the second transceiver interface circuit further includes a fourth ESD circuit, wherein the second and fourth ESD circuits are situated between the second T-coil and the second decoupling capacitor.

Aspect 10: The IC of aspect 9, wherein: the first transceiver interface circuit further includes a first transmitter, wherein the first transmitter is situated between the first and third ESD circuits; and the second transceiver interface circuit further includes a second transmitter, wherein the second transmitter is situated between the second and fourth ESD circuits.

Aspect 11: The IC of any one of aspects 2-10, wherein: the first transceiver interface circuit further includes a first transmitter, wherein the first transmitter is situated between the first T-coil and the first decoupling capacitor; and the second transceiver interface circuit further includes a second transmitter, wherein the second transmitter is situated between the second T-coil and the second decoupling capacitor.

Aspect 12: The IC of claim any one of aspects 2-11 wherein: the first transceiver interface circuit further includes a first receiver, wherein the first decoupling capacitor is situated between the first T-coil and the first receiver; and the second transceiver interface circuit further includes a second receiver, wherein the second T-coil is situated between the second decoupling capacitor and the second receiver.

Aspect 13: The IC of any one of aspects 2-12, wherein: a first set of one or more components are situated between the first T-coil and the first decoupling capacitor; and a second set of one or more components are situated between the second T-coil and the second decoupling capacitor.

Aspect 14: The IC of aspect 2, wherein: the first T-coil is situated adjacent to the first decoupling capacitor; and the second T-coil is situated adjacent to the second decoupling capacitor.

Aspect 15: The IC of aspect 14, wherein: the first transceiver interface circuit further includes a first clamp, wherein the first decoupling capacitor is situated between the first T-coil and the first clamp; and the second transceiver interface circuit further includes a second clamp, wherein the second T-coil is situated between the second decoupling capacitor and the second clamp.

Aspect 16: The IC of aspect 14 or 15, wherein: the first transceiver interface circuit further includes a first electrostatic discharge (ESD) circuit, wherein the first decoupling capacitor is situated between the first T-coil and the first ESD circuit; and the second transceiver interface circuit further includes a second ESD circuit, wherein the second T-coil is situated between the second decoupling capacitor and the second ESD circuit.

Aspect 17: The IC of any one of aspects 14-16, wherein: the first transceiver interface circuit further includes a first transmitter, wherein the first decoupling capacitor is situated between the first T-coil and the first transmitter; and the second transceiver interface circuit further includes a second transmitter, wherein the second T-coil is situated between the second decoupling capacitor and the second transmitter.

Aspect 18: The IC of any one of aspects 14-17, wherein: the first transceiver interface circuit further includes a first receiver, wherein the first decoupling capacitor is situated between the first T-coil and the first receiver; and the second transceiver interface circuit further includes a second receiver, wherein the second T-coil is situated between the second decoupling capacitor and the second receiver.

Aspect 19: The IC of any one of aspects 1-18, further comprising: a third transceiver interface circuit extending longitudinally in the first direction, wherein the second transceiver interface circuit is situated between the first and third transceiver interface circuits, and wherein the third transceiver interface circuit comprises a third T-coil; and a fourth transceiver interface circuit extending longitudinally in the first direction, wherein the third transceiver interface circuit is situated between the second and fourth transceiver interface circuits, wherein the fourth transceiver interface circuit includes a fourth T-coil, wherein the fourth T-coil is offset from the third T-coil along the first direction.

Aspect 20: The IC of aspect 19, wherein: the first and third T-coils substantially align along the second direction; and the second and fourth T-coils substantially align along the second direction.

Aspect 21: A wireless communication device, comprising: at least one antenna; a transceiver coupled to the at least one antenna; a communication link including a set of transmission lines coupled to the transceiver; and an integrated circuit (IC) including a set of transceiver interface circuits coupled to the set of transmission lines, respectively, wherein: the first transceiver interface circuit of the set extends longitudinally in a first direction substantially perpendicular to a second direction parallel to an edge of the IC, wherein the first transceiver interface circuit comprises a first T-coil; and the second transceiver interface circuit of the set extends longitudinally in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
a first transceiver interface circuit extending longitudinally in a first direction substantially perpendicular to a second direction parallel to an edge of the IC, wherein the first transceiver interface circuit comprises a first T-coil; and
a second transceiver interface circuit extending longitudinally in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

2. The IC of claim 1, wherein:
the first transceiver interface circuit further includes a first decoupling capacitor, wherein the first T-coil is situated between the edge of the IC and the first decoupling capacitor; and
the second transceiver interface circuit further includes a second decoupling capacitor, wherein the second decoupling capacitor is situated between the edge of the IC and the second T-coil.

3. The IC of claim 2, wherein the first T-coil and the second decoupling capacitor substantially align along the second direction.

4. The IC of claim 2, wherein the first decoupling capacitors and the second T-coil substantially align along the second direction.

5. The IC of claim 2, wherein:
the first transceiver interface circuit further includes a first clamp, wherein the first clamp is situated between the first T-coil and the first decoupling capacitor; and
the second transceiver interface circuit further includes a second clamp, wherein the second clamp is situated between the second T-coil and the second clamp.

6. The IC of claim 5, wherein the first and second clamps substantially align along the second direction.

7. The IC of claim 2, wherein:
the first transceiver interface circuit further includes a first electrostatic discharge (ESD) circuit, wherein the first ESD circuit is situated between the first T-coil and the first decoupling capacitor; and
the second transceiver interface circuit further includes a second ESD circuit, wherein the second ESD circuit is situated between the second T-coil and the second decoupling capacitor.

8. The IC of claim 7, wherein the first and second ESD circuits substantially align along the second direction.

9. The IC of claim 7, wherein:
the first transceiver interface circuit further includes a third ESD circuit, wherein the first and third ESD circuits are situated between the first T-coil and the first decoupling capacitor; and
the second transceiver interface circuit further includes a fourth ESD circuit, wherein the second and fourth ESD circuits are situated between the second T-coil and the second decoupling capacitor.

10. The IC of claim 9, wherein:
the first transceiver interface circuit further includes a first transmitter, wherein the first transmitter is situated between the first and third ESD circuits; and
the second transceiver interface circuit further includes a second transmitter, wherein the second transmitter is situated between the second and fourth ESD circuits.

11. The IC of claim 2, wherein:
the first transceiver interface circuit further includes a first transmitter, wherein the first transmitter is situated between the first T-coil and the first decoupling capacitor; and
the second transceiver interface circuit further includes a second transmitter, wherein the second transmitter is situated between the second T-coil and the second decoupling capacitor.

12. The IC of claim 2, wherein:
the first transceiver interface circuit further includes a first receiver, wherein the first decoupling capacitor is situated between the first T-coil and the first receiver; and
the second transceiver interface circuit further includes a second receiver, wherein the second T-coil is situated between the second decoupling capacitor and the second receiver.

13. The IC of claim 2, wherein:
a first set of one or more components are situated between the first T-coil and the first decoupling capacitor; and
a second set of one or more components are situated between the second T-coil and the second decoupling capacitor.

14. The IC of claim 2, wherein:
the first T-coil is situated adjacent to the first decoupling capacitor; and
the second T-coil is situated adjacent to the second decoupling capacitor.

15. The IC of claim 14, wherein:
the first transceiver interface circuit further includes a first clamp, wherein the first decoupling capacitor is situated between the first T-coil and the first clamp; and
the second transceiver interface circuit further includes a second clamp, wherein the second T-coil is situated between the second decoupling capacitor and the second clamp.

16. The IC of claim 14, wherein:
the first transceiver interface circuit further includes a first electrostatic discharge (ESD) circuit, wherein the first decoupling capacitor is situated between the first T-coil and the first ESD circuit; and
the second transceiver interface circuit further includes a second ESD circuit, wherein the second T-coil is situated between the second decoupling capacitor and the second ESD circuit.

17. The IC of claim 14, wherein:
the first transceiver interface circuit further includes a first transmitter, wherein the first decoupling capacitor is situated between the first T-coil and the first transmitter; and
the second transceiver interface circuit further includes a second transmitter, wherein the second T-coil is situated between the second decoupling capacitor and the second transmitter.

18. The IC of claim 14, wherein:
the first transceiver interface circuit further includes a first receiver, wherein the first decoupling capacitor is situated between the first T-coil and the first receiver; and
the second transceiver interface circuit further includes a second receiver, wherein the second T-coil is situated between the second decoupling capacitor and the second receiver.

19. The IC of claim 1, further comprising:
a third transceiver interface circuit extending longitudinally in the first direction, wherein the second transceiver interface circuit is situated between the first and third transceiver interface circuits, and wherein the third transceiver interface circuit comprises a third T-coil; and
a fourth transceiver interface circuit extending longitudinally in the first direction, wherein the third transceiver interface circuit is situated between the second and fourth transceiver interface circuits, wherein the fourth transceiver interface circuit includes a fourth T-coil, wherein the fourth T-coil is offset from the third T-coil along the first direction.

20. The IC of claim 19, wherein:
the first and third T-coils substantially align along the second direction; and
the second and fourth T-coils substantially align along the second direction.

21. A wireless communication device, comprising:
at least one antenna;
a transceiver coupled to the at least one antenna;
a communication link including a set of transmission lines coupled to the transceiver; and
an integrated circuit (IC) including a set of transceiver interface circuits coupled to the set of transmission lines, respectively, wherein:
the first transceiver interface circuit of the set extends longitudinally in a first direction substantially perpendicular to a second direction parallel to an edge of the IC, wherein the first transceiver interface circuit comprises a first T-coil; and the second transceiver interface circuit of the set extends longitudinally in the first direction, wherein the second transceiver interface circuit is staggered from the first transceiver interface circuit along the second direction, wherein the second transceiver interface circuit includes a second T-coil, and wherein the second T-coil is offset from the first T-coil along the first direction.

* * * * *